(12) United States Patent
Park et al.

(10) Patent No.: US 7,951,653 B1
(45) Date of Patent: May 31, 2011

(54) METHODS OF MANUFACTURING A SEMICONDUCTOR DEVICE USING COMPOSITIONS FOR ETCHING COPPER

(75) Inventors: Jung-Dae Park, Ansan-si (KR); Da-Hee Lee, Pyeongtaek-si (KR); Seung-Ki Chae, Seoul (KR); Pil-Kwon Jun, Yongin-si (KR); Kwang-Shin Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/948,331

(22) Filed: Nov. 17, 2010

(30) Foreign Application Priority Data

Nov. 27, 2009  (KR) .................. 10-2009-0116222

(51) Int. Cl.
*H01L 21/00* (2006.01)
(52) U.S. Cl. .................. 438/132; 257/209; 257/529
(58) Field of Classification Search .................. 438/132; 257/209, 529
See application file for complete search history.

(56) References Cited

U.S. PATENT DOCUMENTS

| | | | | |
|---|---|---|---|---|
| 6,295,721 B1 * | 10/2001 | Tsai | ................................ | 29/623 |
| 6,316,350 B1 | 11/2001 | Eissa et al. | | |
| 6,498,385 B1 * | 12/2002 | Daubenspeck et al. | ....... | 257/529 |
| 7,759,768 B2 * | 7/2010 | Barth et al. | ................... | 257/532 |
| 2004/0017279 A1 * | 1/2004 | Kamoshima et al. | ......... | 336/200 |

FOREIGN PATENT DOCUMENTS

| | | |
|---|---|---|
| JP | 2005-105411 A | 4/2005 |
| KR | 10-2007-0115916 A | 12/2007 |

* cited by examiner

*Primary Examiner* — Jarrett J Stark
*Assistant Examiner* — Nicholas Tobergte
(74) *Attorney, Agent, or Firm* — Lee & Morse, P.C.

(57) ABSTRACT

A method of manufacturing a semiconductor device includes preparing a substrate on which a fuze line containing copper is formed. The method further includes cutting the fuze line by emitting a laser beam, and applying a composition for etching copper to the substrate to finely etch a cutting area of the fuze line and to substantially remove at least one of a copper residue and a copper oxide residue remaining near the cutting area. The composition for etching copper includes about 0.01 to about 10 percent by weight of an organic acid, about 0.01 to 1.0 percent by weight of an oxidizing agent, and a protic solvent.

13 Claims, 4 Drawing Sheets

METHODS OF MANUFACTURING A SEMICONDUCTOR DEVICE USING COMPOSITIONS FOR ETCHING COPPER

CLAIM OF PRIORITY

This application claims priority under 35 USC §119 to Korean Patent Application No. 2009-0116222, filed on Nov. 27, 2009 in the Korean Intellectual Property Office (KIPO), the contents of which are herein incorporated by reference in their entirety.

BACKGROUND

1. Field

Example embodiments relate to compositions for etching copper and methods of manufacturing a semiconductor device using the same.

2. Description of the Related Art

Generally, a semiconductor device may be manufactured by performing a fabrication process, an electrical die sorting (EDS) process, an assembly process and a test process. The EDS process may include a pre-laser test in which semiconductor chips are inspected, a laser repair process in which defected semiconductor chips are replaced with redundant semiconductor chips, and a post-laser test in which the replaced normal semiconductor chips are inspected.

In the laser repair process, a fuse may be cut so that a pathway of an electrical signal may be converted and defected cells or circuits may be replaced with normal ones. Particularly, a fuse connected to defected cells may be cut by emitting a laser beam having high energy on the fuse, and the defected cells may be replaced with redundant normal cells. A portion of a semiconductor wiring may be used as the fuze.

SUMMARY

Example embodiments provide compositions for etching copper that may reduce defects at a cut fuze line.

Example embodiments provide methods of manufacturing a semiconductor device having the fuze line using the composition.

According to example embodiments, there is provided a method of manufacturing a semiconductor device. In the method, a substrate on which a fuze line containing copper may be prepared. The fuze line may be cut by emitting a laser beam. The composition for etching copper may be applied to the substrate so that a cutting portion of the fuze line may be finely etched and at least one of a copper residue and a copper oxide residue remaining near the cutting portion may be substantially removed. The composition for etching copper may include about 0.01 to about 10 percent by weight of an organic acid, about 0.01 to 1.0 percent by weight of an oxidizing agent and a protic solvent.

In an example embodiment, an organic protecting layer may be formed on the substrate to cover the fuze line. A portion of the protecting layer overlapping the fuze line may be removed to form a first opening. When the composition for etching copper may have contact with a portion of the organic protecting layer exposed by the first opening, the organic protecting layer may not be substantially dissolved by the composition.

In an example embodiment, the organic protecting layer may include at least one of polyimide resin, polybenzoxazole resin and benzocyclobutene resin.

In an example embodiment, a pad including aluminum may be formed on the substrate. An insulation layer may be formed on the substrate to cover the pad. A portion of the insulation layer overlapping the pad may be removed to form a second opening exposing the pad. When the composition for etching copper may have contact with the pad exposed by the second opening, the pad is etched by the composition at an etch rate of less than about 1 Å/min.

In an example embodiment, the organic acid may include at least one of carboxylic acid, amino acid, and alkanesulfonic acid.

In an example embodiment, the organic acid may include amino acid.

In an example embodiment, the oxidizing agent may include at least one of ozone, hydrogen peroxide, nitric acid, sulfuric acid, persulfuric acid, nitrate, persulfate, permanganate, hypochlorite, chlorate, and perchlorate.

In an example embodiment, the oxidizing agent may include hydrogen peroxide.

In an example embodiment, the composition for etching copper may have a pH value of about 4.0 to about 6.0 at a room temperature of about 25° C.

In an example embodiment, the composition for etching copper includes about 0.01 to 1.0 percent by weight of amino acid, about 0.01 to 0.2 percent by weight of hydrogen peroxide, and water.

In an example embodiment, the substrate on which the fuze line is formed may be prepared as follows. The fuze line may be formed on the substrate. An insulation layer may be formed on the substrate to cover the fuze line. An organic protecting layer may be formed on the insulation layer. A first opening may be formed by removing portions of the organic protecting layer and the insulation layer overlapping the fuze line.

In an example embodiment, the substrate on which the fuze line is formed may be prepared as follows. The fuze line and a pad may be formed on the substrate. The insulation layer may be formed on the substrate to cover the fuze line and the pad. An organic protecting layer may be formed on the insulation layer. A first opening may be formed by removing portions of the organic protecting layer and the insulation layer overlapping the fuze line. Portions of the organic protecting layer and the insulation layer overlapping the pad may be removed to form a second opening exposing the pad.

In an example embodiment, the cutting area of the fuze line may be dissolved by the composition at an etch rate of about 20 Å/min to about 300 Å/min.

According to example embodiments, there is provided a composition for etching copper including about 0.01 to about 10 percent by weight of an organic acid, about 0.01 to about 1.0 percent by weight of an oxidizing agent, and a protic solvent. The organic acid may include at least one of carboxylic acid, amino acid, and alkanesulfonic acid.

In an example embodiment, the oxidizing agent may include at least one of ozone, hydrogen peroxide, nitric acid, sulfuric acid, persulfuric acid, nitrate, persulfate, permanganate, hypochlorite, chlorate, and perchlorate.

In an example embodiment, the composition for etching copper may include about 0.01 to about 1.0 percent by weight of amino acid, about 0.01 to about 0.2 percent by weight of hydrogen peroxide, and water.

In an example embodiment, the composition for etching copper may have a pH value of about 4.0 to about 6.0 at a room temperature of about 25° C.

BRIEF DESCRIPTION OF THE DRAWINGS

Example embodiments will be more clearly understood from the following detailed description taken in conjunction with the accompanying drawings, in which.

DETAILED DESCRIPTION OF THE EMBODIMENTS

Figure 1:
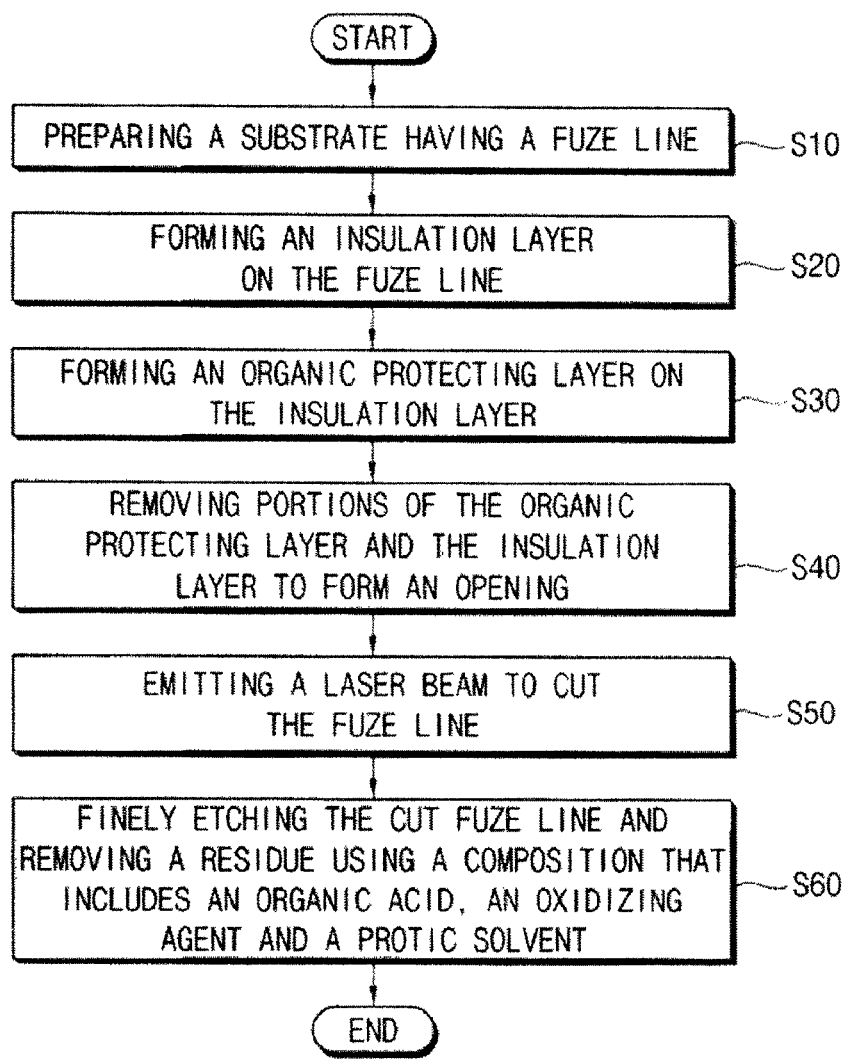
FIG. 1 is a flow chart illustrating a method of manufacturing a semiconductor device according to an example embodiment.

Various example embodiments will be described more fully hereinafter with reference to the accompanying drawings, in which some example embodiments are shown. The present example embodiments may, however, be embodied in many different forms and should not be construed as limited to the example embodiments set forth herein. Rather, these example embodiments are provided so that this description will be thorough and complete, and will fully convey the scope of the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, e.g., from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Compositions for Etching Copper

A composition for etching copper in example embodiments may include an organic acid, an oxidizing agent and a protic solvent. The composition may be used for removing impurities containing copper such as copper oxide that may remain in a fuse line of a semiconductor device, and may be also used for finely etching a cutting area of the fuze line to prevent the fuze line from being electrically connected again by the impurities containing copper. In cleaning the fuze line, the composition may selectively remove a copper residue near the fuze line without damaging conductive structures including other kinds of metal, an insulation layer, a mask layer, an organic protecting layer, etc.

The organic acid of the composition may be reacted with copper or copper oxide to dissolve copper. The organic acid may include an organic compound having a carboxyl group (—COOH) or a sulfonyl group (—OSO$_3$H). For example, the organic acid may include at least one of a carboxylic acid, an amino acid, an alkanesulfonic acid, etc. Particularly, the organic acid may include at least one of acetic acid, citric acid, formic acid, tartaric acid, oxalic acid, phthalic acid, glycollic acid, glycine, cystine, lysine, proline, arginine, methanesulfonic acid, ethanesulfonic acid, etc. These may be used alone or in a mixture thereof.

An amount of the organic acid may be adjusted to selectively remove the residue containing copper near the fuze line without damaging the conductive structures, the insulating layer, the mask layer, the organic protecting layer, etc. that may be formed on a substrate. An amount of the organic acid may be in a range of about 0.01% to about 10.0% by weight, based on a total weight of the composition. In some example embodiments, the amount of the organic acid may be in a range of about 0.01% to about 5% by weight. In other example embodiments, the amount of the organic acid may be in a range of about 0.01% to about 2% by weight. In still other example embodiments, the amount of the organic acid may be in a range of about 0.01% to about 1% by weight. If the composition includes less than about 0.01% by weight of the organic acid, the impurities containing copper remaining in the fuze line may not be removed efficiently in a short time. If the composition includes more than about 10% by weight of the organic acid, other conductive structures such as, e.g., an aluminum wiring or an organic protecting layer may be damaged.

The organic acid having a relatively high solvency for copper may be used in a small amount to prevent damages of other structures or organic layers and to prevent a copper line from being excessively etched. For example, glycine may be used in an amount of about 0.01% to about 1% by weight and/or about 0.01 to about 0.2% by weight. The copper residue may be removed sufficiently without damaging, e.g., by being substantially etched or completely removed, other conductive structures or the organic protecting layers in such a small amount of the organic acid. By maintaining a low concentration of the organic acid, waste water generated from the organic acid and the toxicity of the organic acid to working environments and human bodies may be reduced.

The oxidizing agent may oxidize copper into copper (II) oxide (CuO) or copper (I) oxide ($Cu_2O$). The oxidizing agent may include at least one an organic oxidizing agent or an inorganic oxidizing agent that may be dissolved in the protic solvent. Non-limiting examples of the oxidizing agent include, e.g., ozone, hydrogen peroxide, nitric acid, sulfuric acid, persulfuric acid, nitrate, persulfate, permanganate, hypochlorite, chlorate, perchlorate, etc. These may be used alone or in a mixture thereof.

An amount of the oxidizing agent may be adjusted to selectively remove the copper residue near the fuze line without damaging other conductive structures on the substrate. In some example embodiments, the amount of the oxidizing agent may be in a range of about 0.01% to about 1.0% by weight, based on a total weight of the composition. In other example embodiments, the amount of the oxidizing agent may be in a range of about 0.01% to about 0.5% by weight. In still other example embodiments, the amount of the oxidizing agent may be in a range of about 0.01% to about 0.2% by weight. If the composition includes less than about 0.01% by weight of the oxidizing agent, the impurities containing copper remaining in the fuze line may not be removed efficiently in a short time. If the composition includes more than about 1.0% by weight of the oxidizing agent, other conductive structures exposed on the substrate such as an aluminum layer may be damaged. By maintaining a low concentration of the oxidizing agent, waste water generated from the oxidizing agent and the toxicity of the oxidizing agent to working environments and human bodies may be reduced.

The protic solvent may dissolve the organic acid and the oxidizing agent. For example, the protic solvent may include water, methanol, ethanol, etc. Water may have a high solubility for hydrogen peroxide and the organic acid and reduce an amount of remaining organic compounds. Water may be used in the form of deionized water or ultra pure water. The protic solvent may occupy the largest portion of the composition for etching copper, and an amount of the protic solvent may not be limited.

In some example embodiments, the composition for etching copper may include a pH modifier. The pH modifier may control a final pH of the composition to reduce damages of other structures or layers and change an etch rate for copper and copper oxide. Non-limiting examples of the pH modifier may include hydrochloric acid, sodium hydroxide, etc.

The composition for etching copper may be in a weak acidic condition to remove the copper residue efficiently while preventing other layers such as the aluminum layer from being damaged. In an example embodiment, the pH value of the composition for etching copper may be in a range of about 4 to about 6 at room temperature (about 25° C.). In another example embodiment, the pH value of the composition for etching copper may be in a range of about 5.0 to about 5.9 at room temperature (about 25° C.). If the composition for etching copper is basic, a solvency of copper of the composition may be reduced severely. If the composition for etching copper is strong acidic having a pH value less than about pH 4, other conductive structures (e.g., aluminum layer) may be damaged and problems such as corrosion of equipment and treatment of waste water may be caused.

Methods of Manufacturing a Semiconductor Device

Figure 2:
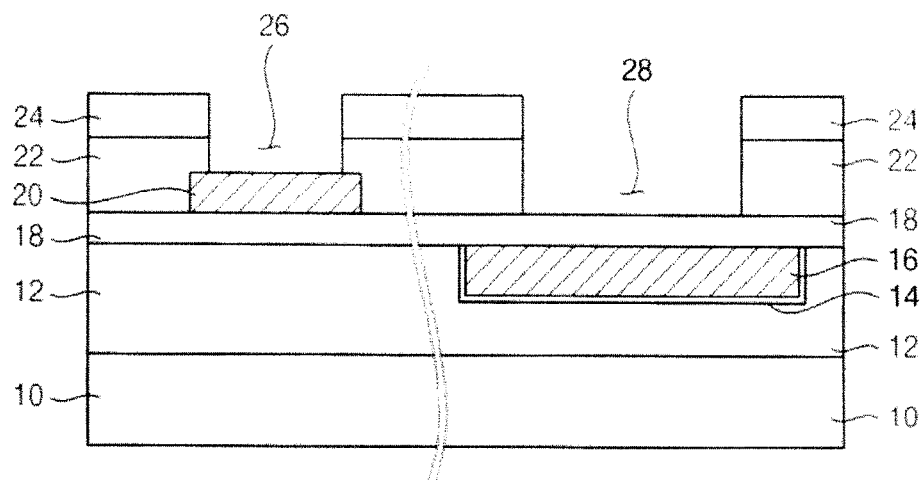
FIGS. 2 to 4 are cross-sectional views illustrating a method of manufacturing a semiconductor device according to an example embodiment.
Figure 3:
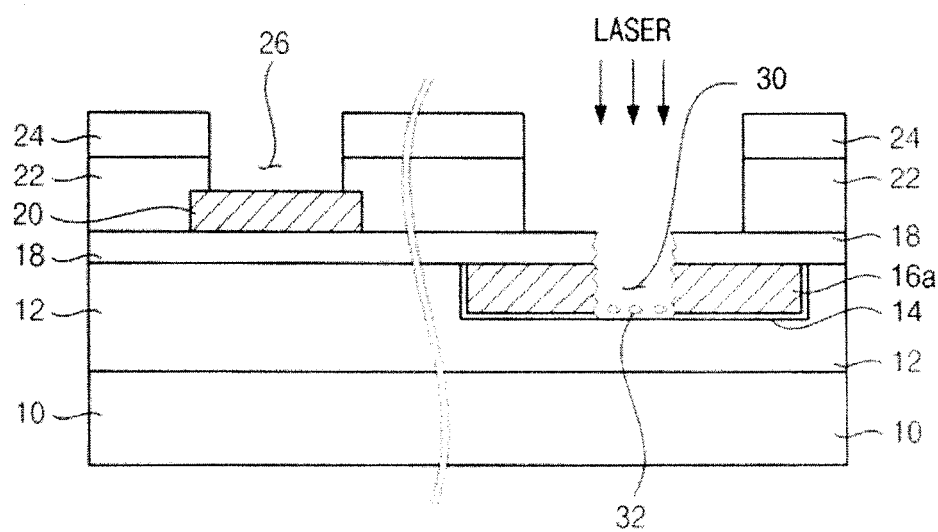
Figure 4:
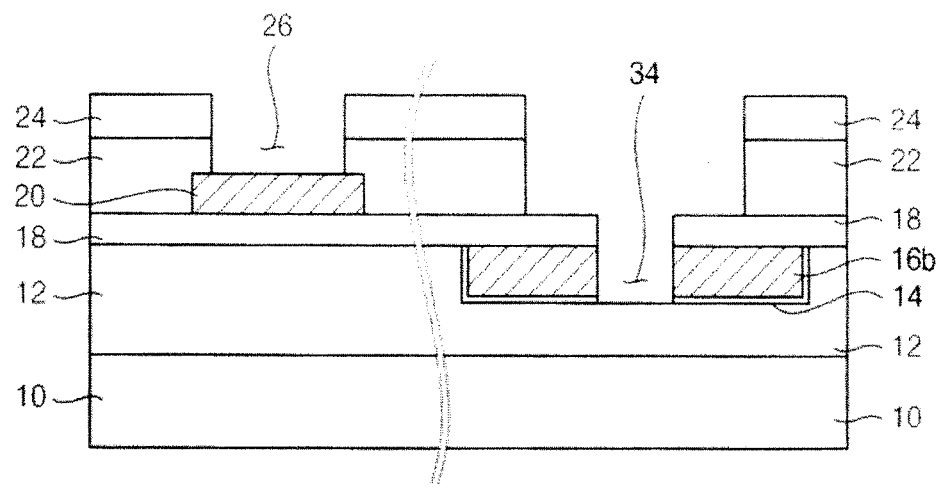

FIG. 1 is a flowchart illustrating a method of manufacturing a semiconductor device in accordance with example embodiments. FIGS. 2 to 4 are cross-sectional views illustrating a method of manufacturing the semiconductor device in accordance with example embodiments.

Referring to FIGS. 1 and 2, in step S10, a substrate 10 on which a fuze line is formed may be prepared. The substrate 10 may include a semiconductor material such as silicon (Si) or germanium (Ge). The substrate 10 may include a fuze region in which a fuze is formed and a cell region in which memory cells having e.g., a transistor and/or a capacitor are formed. The fuze region may be a portion of a peripheral region in which a circuit for controlling the operation of the memory cells in the cell region may be formed. A pad 20 for transferring an electrical signal to a transistor, a capacitor or a wiring may be formed in the cell region and/or the peripheral region.

In example embodiments, a first insulating interlayer 12 having a recess may be formed on the substrate 10 and a fuze line 16 may be formed using copper on the first insulating interlayer 12 to fill the recess. The first insulating interlayer 12 may insulate a conductive structure such as the fuze line 16 embedded therein. The first insulating interlayer 12 may be formed using an insulating material such as oxide, nitride, or oxynitride. Copper has a low resistivity to reduce an electrical resistance of a wiring. An electroplating process or a thin film deposition process may be performed using copper on the recess of the first insulating interlayer 12 to form the fuze line 16. Prior to forming the fuze line 16, a barrier layer 14 may be further formed on the recess to prevent copper from diffusing into the first insulating interlayer 12.

A second insulating interlayer 18 may be formed on the first insulating interlayer 12 on which the fuze line 16 may be formed using an insulating material such as oxide, nitride, or oxynitride. The pad 20 for transferring an electrical signal to a transistor, a capacitor or a wiring may be formed on the second insulating interlayer 16 in the cell region and/or the peripheral region. The pad 20 may be formed using a conductive material such as metal, a conductive metal nitride, a metal silicide, and the like. In example embodiments, the pad 20 may be formed using a metal having a low resistivity such as aluminum (Al), tungsten (Tu), etc.

In step S20, an insulation layer 22 may be formed on the second insulating interlayer 18 to cover the pad 20. In step S30, an organic protecting layer 24 may be formed on the insulating layer 22. The insulation layer 22 may be formed using an insulating material such as silicon oxide, silicon nitride, silicon oxynitride, etc. The insulation layer 22 and the organic protecting layer 24 may protect lower structures on the substrate 10. The organic protecting layer 24 may be formed using at least one organic protecting material such as polyimide resin, polybenzoxazole resin and benzocyclobutene resin, a combination thereof, etc.

In step S40, portions of the organic protecting layer 24 and the insulation layer 22 overlapping the fuze line 16 may be removed to form a first opening 28. A portion of the second insulating interlayer 18 on the fuze line 16 may be exposed by the first opening 28. When the second insulating interlayer 18 is relatively thick, the exposed portion of the second insulating interlayer 18 on the fuze line 16 may be partially removed until the location of the fuze line 16 may be noticed. Alternatively, the portion of the second insulating interlayer 18 on the fuze line 16 may be completely removed to expose the fuze line 16. Portions of the organic protecting layer 24 and the insulating layer 22 on the pad 20 may be removed to form a second opening 26 that may expose the pad 20.

When the organic protecting layer 24 may be formed using photosensitive polyimide, the portion of the organic protecting layer 24 may be removed by an exposure process and a developing process on a photosensitive polyimide layer. After removing the portion of the organic protecting layer 24, the portions of the insulating layer 22 may be removed to form the first opening 28 and the second opening 26 that may expose the pad 20. Alternatively, a photoresist pattern (not shown) may be formed on the organic protecting layer 24, and the organic protecting layer 24 and the insulating layer 22 may be sequentially removed using the photoresist pattern as an etching mask to form the first and second openings 28 and 26.

Referring to FIGS. 1 and 3, in step S50, the fuze line 16 may be cut by emitting a laser beam into the first opening 28. The laser beam having a high energy may be emitted from a laser repair apparatus. The fuze line 16 connected to defected cells may be cut and the defected cells may be replaced with redundant normal cells. By performing the laser repair process, a cut fuze line 16a having a cutting area 30 may be formed.

During cutting the fuze line 16 by the laser beam, some portions of copper composing the fuze line 16 may be vaporized as a fume, other portions may be reacted with oxygen in an atmosphere to remain as copper oxide and still other portions may not be removed to remain. Thus, copper or copper oxide residue, i.e., a copper-containing residue 32 may remain in the cutting area 30 of the cut fuze line 16a. When the copper-containing residue 32 is excessively generated, the cut fuze line 16a that has been cut using the laser beam may be electrically connected again to the defected cells by the copper-containing residue 32 to cause a current leakage and bad operation of the semiconductor device.

Referring to FIGS. 1 and 4, in step S60, the copper-containing residue 32 may be removed and the cut fuze line 16a near the cutting area 30 may be finely etched using a composition for etching copper that may include an organic acid, an oxidizing agent and a protic solvent, so that the current leakage through the cutting area 30 may be reduced.

The organic acid in the composition for etching copper may be reacted with copper or copper oxide to dissolve the residue 32, and the oxidizing agent may oxidize copper into copper (II) oxide (CuO) or copper (I) oxide ($Cu_2O$). Contents of the organic acid and the oxidizing agent may be adjusted to remove the residue 32 efficiently and prevent the organic protecting layer 24, the insulating layer 22 and the pad 20 from being damaged, e.g., from being substantially etched and/or completely removed by the composition for etching copper. In some example embodiments, an amount of the organic acid may be in a range of about 0.01% to about 10.0% by weight, based on a total weight of the composition and an amount of the oxidizing agent may be in a range of about 0.01% to about 1.0% by weight. In other example embodiments, the amount of the organic acid may be in a range of 0.01% to 1.0% by weight and the amount of the oxidizing agent may be in a range of 0.01% to 0.2% by weight. In this case, the copper-containing residue 32 may be removed sufficiently without damaging the organic protecting layer 24, the insulating layer 22 and the pad 20. Additionally, waste water from the composition and toxicity of the composition to working environments and human bodies may be reduced.

When the composition may be weak acidic, the copper-containing residue 32 may be removed efficiently while preventing an aluminum layer or other layers from being damaged. In an example embodiment, the pH value of the composition for etching copper may be in a range of about 4 to about 6 at a room temperature (about 25° C.). In another example embodiment, the pH value of the composition for etching copper may be in a range of about 5 to about 5.9 at a room temperature (about 25° C.).

The exposed portion of the cut fuze line 16a may be finely etched at an etch rate of about 20 Å/min to about 300 Å/min during applying the composition for etching copper to the substrate 10. When the cut fuze line 16a is etched at an etch rate more than about 300 Å/min, the cut fuze line 16a may be excessively etched. Otherwise, when the cut fuze line 16a is etched at an etch rate below about 20 Å/min, the copper-containing residue 32 may not be easily removed, and thus a cleaning time may be required very much.

When the cut fuse line 16a is etched, the composition for etching copper may contact the pad 20 exposed by the second opening 26. The pad 20 may be dissolved by the composition at an etch rate less than about 10 Å/min. In example embodiments, when the pad 20 includes aluminum, the pad 20 may be dissolved by the composition at an etch rate less than about 1 Å/min. Thus, the pad 20 may not be damaged even though the composition may contact the pad 20. The organic protecting layer 24 and the insulating layer 22 may not be dissolved substantially by adjusting the contents of chemical agents and pH even though the composition may contact the organic protecting layer 24 and the insulating layer 22.

The composition for etching copper may be applied to the substrate 10 having the cut fuze line 16a that may have been cut by using a batch type or a spray type cleaning apparatus. When the batch type cleaning apparatus is used, the substrate 10 may be cleaned by immersing the substrate 10 in the composition. When the spray type cleaning apparatus is used, the substrate 10 may be cleaned by injecting the composition to the substrate 10. A cleaning time may be adjusted in a range of about 1 minute to about 30 minutes and the composition may be applied to the substrate 10 at a room temperature or at a temperature in a range of about 15° C. to about 50° C.

The copper-containing residue 32 may be removed and the cut fuze line 16a near the cutting area 30 may be finely etched by applying the composition to the substrate 10 to form an etched fuze line 16b that may include a clean cutting area 34.

The substrate 10 including the etched fuze line 16b may be cleaned by pure water and may be dried under a nitrogen atmosphere. In some example embodiments, a filler (not shown) may be formed on the first insulating interlayer 12 to fill the space near the cutting area 34 of the etched fuze line 6b using polyimide, polybezoxazole or benzocyclobutene resin, so that defects by impurities may be prevented.

Synthesis of Compositions for Etching Copper and Evaluation on Etching Ability for Copper Thereof Comparative Examples 1 to 9

Evaluation on Etching Ability for Copper

Etching abilities for copper of Comparative Examples were evaluated.

As shown in Table 1, each of Comparative Examples 1 to 8 had a composition including an organic material and deionized water (DIW), and Comparative Example 9 had a composition including an oxidizing agent and DIW. Etch rates and etching abilities for copper of Comparative Examples 1 to 9 were evaluated. Raw materials for forming the compositions were highly pure and were used without additional refinement.

A plasma enhanced tetra ethyl ortho silicate (PE-TEOS) layer having a thickness of about 1000 Å and a copper layer having a thickness of about 300 Å were sequentially formed on a silicon wafer to form a specimen. The compositions of Comparative Examples 1 to 9 of about 50 μl were applied to the specimen, and then the color change of the surface of the copper layer was detected after about 5 minutes. The copper layer surface is normally shining yellow, however, becomes orange as the color changes. When the copper layer is completely removed, the specimen becomes purple that is the color of the PE-TEOS layer.

A silicon wafer was coated with a copper layer having a thickness of about 6000 Å to prepare a specimen and evaluate etch rates for the copper layer of the compositions in Comparative Examples 1 to 9. The copper layer was dissolved by immersing the silicon wafer in the compositions for about 5 minutes and the resistance change of the copper layer surface was measured to be converted into the etch rate. The result is shown in Table 1 below.

TABLE 1

| | Organic acid (wt %) | Oxidizing agent (wt %) | DIW (wt %) | Cu solvency | Cu etch rate (Å/min) |
|---|---|---|---|---|---|
| Comparative Example 1 | Acetic acid (0.1) | - | 99.9 | ⊙ | 8.8 |
| Comparative Example 2 | citric acid (0.1) | - | 99.9 | ○ | 5.3 |
| Comparative Example 3 | tartaric acid (0.1) | - | 99.9 | ○ | 4.2 |
| Comparative Example 4 | oxalic acid (0.1) | - | 99.9 | ○ | 7.3 |
| Comparative Example 5 | glycine (0.1) | - | 99.9 | ◎ | 12.8 |
| Comparative Example 6 | cystine (0.1) | - | 99.9 | ⊙ | 9.6 |
| Comparative Example 7 | ethanol (0.1) | - | 99.9 | X | <1.0 |
| Comparative Example 8 | methane sulfonic acid (0.1) | - | 99.9 | ⊙ | 8.7 |
| Comparative Example 9 | - | $H_2O_2$ (0.1) | 99.9 | X | <1.0 |

In Table 1, a Cu solvency was evaluated relatively by detecting the color change of the copper layer. Here, X, ○, ⊙, and ◎ indicate the relative Cu solvency (X<○<⊙<◎).

Referring to Table 1, organic acids having a carboxylic group, amino acid and sulfonic acid showed a relatively high Cu solvency resulting in the color change of the copper layer. However, the compositions including only either alcohol or an oxidizing agent did not show the color change.

Examples 1 to 6

Evaluation of an Etching Ability by Adding an Oxidizing Agent

Compositions for etching copper were prepared by mixing an organic acid, an oxidizing agent and deionized water in order to evaluate an etching ability thereof. In Examples 1 to 6, the compositions for etching copper were prepared by using citric acid as an organic acid and changing the kinds of the oxidizing agent. The contents and kinds of compounds used for preparing the compositions are illustrated in Table 2 below.

Etching abilities of the compositions in Examples 1 to 6 were evaluated by detecting a color change and an etch rate of a copper layer as in Comparative Examples 1 to 8. A PE-TEOS layer having a thickness of about 1000 Å and a copper layer having a thickness of about 300 Å were sequentially formed on a silicon wafer to form a specimen. The compositions of Examples 1 to 6 of about 50 μl were applied to the specimen, and then color change of the surface of the copper layer surface was detected after about 5 minutes.

A silicon wafer was coated with a copper layer having a thickness of about 6000 Å to prepare a specimen and evaluate etch rates for the copper layer of the compositions in Examples 1 to 9. The copper layer was dissolved by immersing the silicon wafer in the compositions for about 5 minutes and the resistance change of the copper layer surface was measured by detecting the thickness change of the copper layer to be converted into the etch rate. The result is shown in Table 2 along with Comparative Example 2 for a relative evaluation.

TABLE 2

| | Organic acid (wt %) | Oxidizing agent (wt %) | DIW (wt %) | Cu solvency | Cu etch rate (Å min) |
|---|---|---|---|---|---|
| Comparative Example 2 | citric acid (0.1) | - | 99.8 | Δ | 5.3 |
| Example 1 | citric acid (0.1) | $H_2O_2$ (0.1) | 99.8 | ○ | 31.3 |
| Example 2 | citric acid (0.1) | $HNO_3$ (0.1) | 99.8 | ◎ | 55.2 |
| Example 3 | citric acid (0.1) | $H_2SO_4$ (0.1) | 99.8 | ◎ | 57.1 |
| Example 4 | citric acid (0.1) | $NH_4NO_3$ (0.1) | 99.8 | ○ | 26.2 |
| Example 5 | citric acid (0.1) | $KMnO_4$ (0.1) | 99.8 | ⊙ | 44.5 |
| Example 6 | citric acid (0.1) | $NaClO_4$ (0.1) | 99.8 | ⊙ | 37.9 |

In Table 2, a Cu solvency was evaluated relatively by detecting the color change of the copper layer. Here, Δ, ○, ⊙, and ◎ indicate the relative Cu solvency (Δ<○<⊙<◎).

Referring to Table 2, the Cu solvency and the etch rate increased sharply in Examples 1 to 6 compared to Comparative Example 2. Particularly, compositions in Examples 2 and 3 having a strong acid showed the relatively high Cu solvency and etch rate.

Examples 7 to 9

Evaluation on an Etching Ability According to Organic Acids

Compositions for etching copper were prepared by mixing an organic acid, an oxidizing agent and deionized water in order to evaluate etching abilities thereof. In Examples 7 to 9, the compositions for etching copper were prepared by using hydrogen peroxide as an oxidizing agent and changing the kinds of the organic acid. The contents and kinds of compounds used for preparing the compositions are shown in Table 3 below.

Etching abilities of the compositions in Examples 7 to 9 were evaluated by detecting a color change and an etch rate of the copper layer as in Examples 1 to 6. The result is shown in Table 3 along with Example 1 for a relative evaluation.

TABLE 3

|  | Organic acid (wt %) | Oxidizing agent (wt %) | DIW (wt %) | pH | Cu solvency | Cu etch rate (Å/min) |
|---|---|---|---|---|---|---|
| Example 1 | citric acid (0.1) | $H_2O_2$ (0.1) | 99.8 | 2.61 | ○ | 31.3 |
| Example 7 | actic acid (0.1) | $H_2O_2$ (0.1) | 99.8 | — | ⊙ | 75.2 |
| Example 8 | tartaric acid (0.1) | $H_2O_2$ (0.1) | 99.8 | 2.48 | ○ | 29.8 |
| Example 9 | glycine (0.1) | $H_2O_2$ (0.1) | 99.8 | 5.83 | ⊚ | 91.1 |

In Table 3, a Cu solvency was evaluated relatively by detecting the color change of the copper layer. Here, ○, ⊙, and ⊚ indicate the relative Cu solvency (○<⊙<⊚), and pH values were measured at a room temperature (about 25° C.) by a pH meter.

As shown in Table 3, the compositions showed different etching abilities according to the organic acid included therein. When amino acid-based glycine was used, the copper layer was completely removed. Acetic acid was shown to have a relatively strong Cu solvency among carboxylic acids Further, the compositions of Examples 1 and 7 were applied to an aluminum layer and a polyimide layer in order to observe the etch rate of the layer. A wafer piece on which the aluminum layer having a thickness of about 5000 Å was formed and a wafer piece on which the polyimide layer used as a passivation layer was formed were prepared to form specimens. The specimens were immersed in the compositions of Examples 1 and 2, rinsed by ultra pure water, and dried under a nitrogen atmosphere. The etch rate of the aluminum layer was calculated by converting a resistance change into a thickness change. A damage of the polyimide layer was judged by inspecting a surface of the layer visually and measuring total contents of carbon before and after the immersing. The result is shown in Table 4 along with Cu etch rates for a relative evaluation.

TABLE 4

|  | Cu etch rate (Å/min) | Al etch rate (Å/min) | Damage of polyimide layer |
|---|---|---|---|
| Example 1 | 31.3 | <1.0 | X |
| Example 7 | 75.2 | <1.0 | X |

Referring to Table 4, the compositions of Examples 1 and 7 may be used for etching a copper layer without damaging an aluminum layer. Before and after the immersing, the surface of the polyimide layer was not shown to have any damage and total contents of carbon in the polyimide layer were in an experimental tolerance. Therefore, the compositions including organic acids and oxidizing agents in accordance with example embodiments may be used for selectively removing the copper layer without damaging the aluminum layer and the polyimide layer.

Examples 10-13 and Comparative Example 10

Evaluation on Etching Ability According to Contents of Organic Acid, Oxidizing Agent and pH Values Compositions for etching copper were prepared by using citric acid as an organic acid, using hydrogen peroxide as an oxidizing agent, and varying the contents of the compounds or kinds of pH modifier in Examples 10-13 and Comparative Example 10. The compositions of Examples 10-12 included a different amount of citric acid and hydrogen peroxide, respectively. The compositions of Example 13 and Comparative Example 10 had different pH values from each other by adding different pH modifiers. The contents and kinds of compounds for preparing compositions are shown in Table 5.

Etching abilities of the compositions in Examples 10 to 13 and Comparative Example 10 were evaluated by detecting the color change and the etch rate of the copper layer as in Examples 1 to 9. The result is illustrated in Table 5 along with Example 1 for a relative evaluation.

TABLE 5

|  | Citric acid, wt % | $H_2O_2$, wt % | DIW, wt % | pH controlling additive | pH | Cu solvency | Cu etch rate (Å/min) |
|---|---|---|---|---|---|---|---|
| Example 1 | 0.1% | 0.1% | 99.8% | — | 2.61 | ⊙ | 31.3 |
| Example 10 | 0.01% | 0.1% | 99.89% | — | — | ○ | 12.6 |
| Example 11 | 0.1% | 0.01% | 99.89% | — | — | ○ | 22.3 |
| Example 12 | 0.01% | 0.01% | 99.98% | — | — | Δ | 8.2 |
| Example 13 | 0.01% | 0.01% | 99.8% | HCl, 0.18% | 1.51 | ○ | 11.4 |
| Comparative Example 10 | 0.01% | 0.01% | 99.8% | $NH_4OH$, 0.18% | 9.12 | X | <1.0 |

In Table 5, a Cu solvency was evaluated relatively by detecting the color change of the copper layer. Here, X, ○, Δ and ⊙ indicate the relative Cu solvency (X<Δ<○<⊙), and pH values were measured at a room temperature (about 25° C.) by a pH meter.

Referring to Table 5, a Cu etch rate was decreased as the amount of the organic acid and the oxidizing agent was reduced. The Cu etch rate was shown to be affected more by reducing the amount of the organic acid than by reducing the amount of the oxidizing agent. The compositions may include the organic acid and the oxidizing agent of equal to or more than about 0.01 wt %, respectively, and the compositions may include at least one of the organic acid and the oxidizing agent of more than about 0.01 wt % for showing the sufficient Cu etch rate. For example, the amount of the organic acid and the oxidizing agent may be more than about 0.01 wt %, respectively, and at least one of the organic acid and the oxidizing agent may be included by the amount of more than about 0.05 wt % (e.g. about 0.1 wt %).

When hydrochloric acid (HCl) was added to the composition having citric acid and hydrogen peroxide of about 0.01 wt %, respectively, the Cu etch rate was increased slightly. However, when the composition was controlled to be basic (having a pH of more than about 7) by adding ammonium hydroxide ($NH_4OH$), the Cu etch rate was decreased greatly and the copper layer was hardly removed.

Evaluation on Cleaning Ability for a Fuze Line

A cleaning ability for a fuze line was evaluated using the composition of Example 9 (having a pH value of about 5.8 and at room temperature of about 25° C.). Ammonium hydroxide was added to the composition of Example 9 to prepare a composition of Comparative Example 11 having a pH value of about 9.0.

A silicon oxide layer having a recess was formed on a silicon wafer and a Cu wiring having a thickness of about 300 nm was formed in the recess to prepare a fuze line specimen. After cutting the Cu wiring by a laser beam, the compositions of Example 9 and Comparative Example 11 were applied to the Cu wiring to remove copper or copper oxide residue. The Compositions were applied to the Cu wiring for about 5 minutes, and the Cu wiring was cleaned by water for about 5 minutes. Subsequently, the specimen was dried in a nitrogen atmosphere for about 10 minutes.

Figure 5:
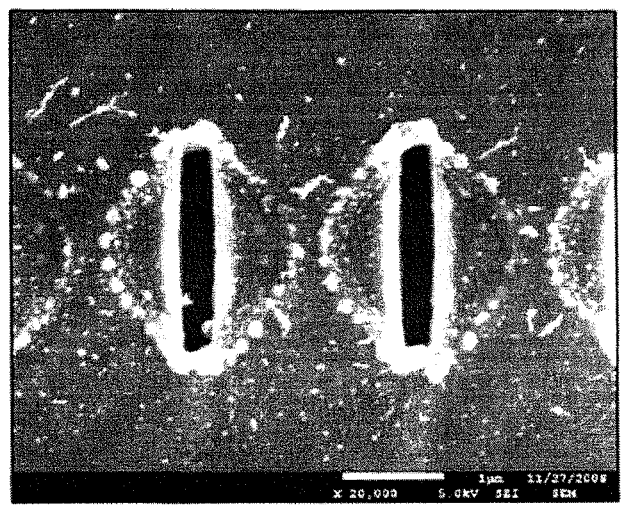
FIG. 5 is a scanning electron microscope (SEM) photo illustrating a cutting edge of a copper line that is cut by a laser beam.
Figure 6:
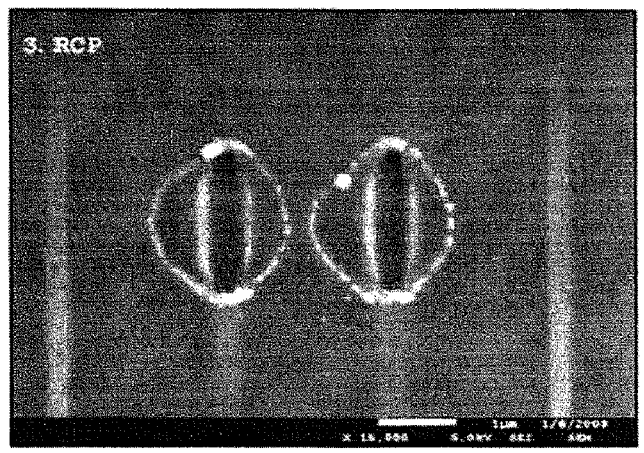
FIGS. 6 to 7 are scanning electron microscope (SEM) photos illustrating a cutting edge of a copper line from which a Cu residue is removed by using compositions of Example 9 and Comparative Example 11, respectively.
Figure 7:
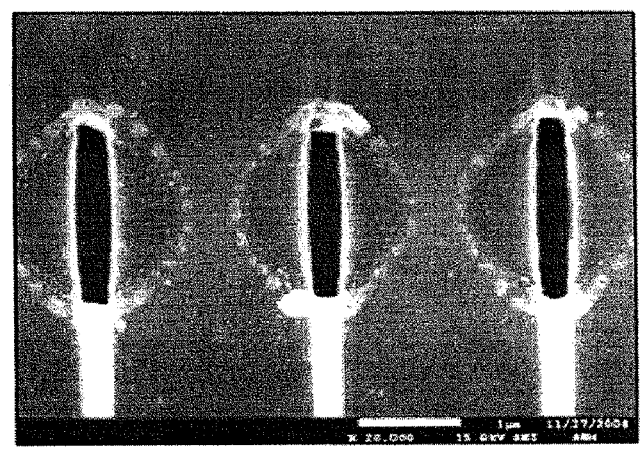

FIG. 5 is a scanning electron microscope (SEM) photo illustrating a cutting edge of a copper line that is cut by the laser beam. FIGS. 6 to 7 are scanning electron microscope (SEM) photos illustrating a cutting edge of the copper line from which the Cu residue is substantially removed by using the compositions of Example 9 and Comparative Example 11, respectively.

Referring to FIGS. 5 to 7, the Cu residue was clearly removed using the compositions of Example 9 and Comparative Example 11. As shown in FIG. 6, the Cu residue in a cutting area was clearly removed without damaging the Cu wiring near the cutting area when the composition of Example 9 was used. However, as shown in FIG. 7, the fuze line near the cutting area was excessively etched to damage the Cu wiring when the composition of Comparative Example 11 including ammonium hydroxide was used.

According to example embodiments, impurities including copper or copper oxide may be removed efficiently by using a composition including a small amount of an organic acid and an oxidizing agent after a laser repair process. Additionally, a fuze line containing copper may be protected against being excessively etched and an organic protecting layer, an insulation layer and a conductive layer including metal may be prevented from being damaged so that defects such as a current leakage may be reduced in the fuze line of a semiconductor device.

The foregoing is illustrative of example embodiments and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A method of manufacturing a semiconductor device, comprising:
   preparing a substrate having a fuze line containing copper formed thereon;
   cutting the fuze line by emitting a laser beam thereto; and
   applying a composition for etching copper to the substrate to finely etch a cutting area of the cut fuze line and to substantially remove at least one of a copper residue and a copper oxide residue remaining near the cutting area,
   wherein the composition for etching copper includes about 0.01 to about 10 percent by weight of an organic acid, about 0.01 to about 1.0 percent by weight of an oxidizing agent, and a protic solvent.

2. The method of claim 1, further comprising:
   forming an organic protecting layer on the substrate to cover the fuze line; and
   removing a portion of the organic protecting layer overlapping the fuze line to form a first opening,
   wherein when the composition for etching copper contacts a portion of the organic protecting layer surrounding the first opening, the organic protecting layer is not substantially dissolved by the composition for etching copper.

3. The method of claim 2, wherein the organic protecting layer includes at least one of polyimide resin, polybenzoxazole resin, and benzocyclobutene resin.

4. The method of claim 1, further comprising:
   forming a pad including aluminum on the substrate;
   forming an insulation layer on the substrate to cover the pad; and
   removing a portion of the insulation layer overlapping the pad to form a second opening exposing the pad,
   wherein when the composition for etching copper contacts the pad exposed by the second opening, the pad is etched by the composition at an etch rate of less than about 1 Å/min.

5. The method of claim 1, wherein the organic acid includes at least one of carboxylic acid, amino acid, and alkanesulfonic acid.

6. The method of claim 5, wherein the organic acid includes amino acid.

7. The method of claim 1, wherein the oxidizing agent includes at least one of ozone, hydrogen peroxide, nitric acid, sulfuric acid, persulfuric acid, nitrate, persulfate, permanganate, hypochlorite, chlorate, and perchlorate.

8. The method of claim 7, wherein the oxidizing agent includes hydrogen peroxide.

9. The method of claim 1, wherein the composition for etching copper has a pH value of about 4.0 to about 6.0 at a room temperature of about 25° C.

10. The method of claim 1, wherein the composition for etching copper includes:
  about 0.01 to about 1 percent by weight of amino acid;
  about 0.01 to about 0.2 percent by weight of hydrogen peroxide; and
  water.

11. The method of claim 1, wherein preparing the substrate on which the fuze line is formed includes:
  forming the fuze line on the substrate;
  forming an insulation layer on the substrate to cover the fuze line;
  forming an organic protecting layer on the insulation layer; and
  forming a first opening by removing portions of the organic protecting layer and the insulation layer overlapping the fuze line.

12. The method of claim 1, wherein preparing the substrate on which the fuze line is formed includes:
  forming the fuze line and a pad on the substrate;
  forming an insulation layer on the substrate to cover the fuze line and the pad;
  forming an organic protecting layer on the insulation layer;
  forming a first opening by removing portions of the organic protecting layer and the insulation layer overlapping the fuze line; and
  forming a second opening exposing the pad by removing portions of the organic protecting layer and the insulation layer overlapping the pad.

13. The method of claim 1, wherein the cutting area of the fuze line is dissolved by the composition at an etch rate of about 20 Å/min to about 300 Å/min.

* * * * *